(12) United States Patent
Sudalaiyandi et al.

(10) Patent No.: US 10,666,270 B2
(45) Date of Patent: May 26, 2020

(54) DIGITAL DELAY LOCKED LOOP

(71) Applicant: Commissariat à l'Energie Atomique et aux Energies Alternatives, Paris (FR)

(72) Inventors: Shanthi Sudalaiyandi, Bangalore (IN); Gilles Masson, La Buisse (FR); Michaël Pelissier, Grenoble (FR); Mykhailo Zarudniev, Grenoble (FR)

(73) Assignee: COMMISSARIAT Á L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/228,921

(22) Filed: Dec. 21, 2018

(65) Prior Publication Data
US 2019/0199361 A1    Jun. 27, 2019

(30) Foreign Application Priority Data

Dec. 26, 2017    (FR) ...................................... 1763220

(51) Int. Cl.
*H03L 7/06* (2006.01)
*H03L 7/081* (2006.01)
(Continued)

(52) U.S. Cl.
CPC ........... *H03L 7/0814* (2013.01); *H03K 5/131* (2013.01); *H03L 7/085* (2013.01); *H03L 2207/50* (2013.01)

(58) Field of Classification Search
CPC ... H03L 7/0814; H03L 7/0812; H03L 7/0805; H03L 7/087; G11C 7/222
(Continued)

(56) References Cited

U.S. PATENT DOCUMENTS 5,949,264 A * 9/1999 Lo ........................ H03D 13/004
                                                        327/148
8,558,728 B1   10/2013 Lemkin et al.
(Continued)

FOREIGN PATENT DOCUMENTS

WO        2015160344 A1    10/2015

OTHER PUBLICATIONS

Preliminary Search Report for French Application No. 1763220 dated Sep. 19, 2018, 2 pages.
(Continued)

*Primary Examiner* — Anh Q Tra
(74) *Attorney, Agent, or Firm* — Moreno IP Law LLC

(57) ABSTRACT

The invention concerns a digital delay locked loop comprising: first and second digitally controllable delay lines (202B, 204B) coupled in series with each other, each comprising a lead portion (214, 218) and a lag portion (216, 220), the first digitally controllable delay line receiving a reference timing signal (TREF) and the second digitally controllable delay line outputting a delayed timing signal (TREF'); and a time to digital converter (212) configured to evaluate a phase difference between the reference signal (TREF) and the delayed timing signal (TREF') and to generate a first control signal (DLEAD_[0:n]) for controlling said lead portions (214, 218) or a second control signal (DLAG[0:n]) for controlling said lag portions (216, 220) based on the sign and magnitude of the phase difference.

7 Claims, 11 Drawing Sheets

(51) Int. Cl.
*H03L 7/085* (2006.01)
*H03K 5/131* (2014.01)
(58) Field of Classification Search
USPC .......................................................... 327/158
See application file for complete search history.

(56) References Cited

U.S. PATENT DOCUMENTS

| | | | |
|---|---|---|---|
| 9,432,025 B1 | 8/2016 | Khor | |
| 9,971,378 B1* | 5/2018 | Fahim | ................... H03L 7/0812 |
| 2002/0172314 A1* | 11/2002 | Lin | .................... H03K 5/15013 |
| | | | 375/376 |
| 2003/0001650 A1* | 1/2003 | Cao | ....................... H03L 7/0805 |
| | | | 327/277 |
| 2004/0130366 A1* | 7/2004 | Lin | ..................... G11C 7/1072 |
| | | | 327/158 |

OTHER PUBLICATIONS

F. Lin et al., "A Register-Controlled Symmetrical DLL for Double-Data-Rate DRAM," IEEE Journal of Solid-State Circuits, vol. 34, No. 4, Apr. 1999, p. 565-.

* cited by examiner

DIGITAL DELAY LOCKED LOOP

FIELD

The present disclosure relates to the field of timing signal generators such as clock generators, and more specifically to delay locked loops.

BACKGROUND

Delay locked loops (DLLs) are widely employed for clock generation and synchronization as an alternative to other forms of timing generators, such as phase locked loops (PLLs). A DLL permits the significant timing edges of the timing signal to be phase shifted. DLLs generally comprise a delay line having tunable delay elements for delaying a reference timing signal, and a phase detector that determines the phase difference between the reference timing signal and the delayed reference signal. A control circuit is then used to convert this phase difference into appropriate control signals for tuning the delay line.

DLLs provide the advantage with respect to PLLs of better jitter performance, because phase errors are not accumulated in noisy environments.

It has been proposed to provide fully digital DLLs, which provide the advantage of benefiting from CMOS technology scaling, allowing reduced chip area, reduced power consumption, and ease of migration towards future advanced CMOS process nodes. However, fully digital DLLs generally lead to high design complexity, and thus a relatively high circuit area and power consumption.

There is thus a need in the art for a fully digital DLL providing relatively low complexity, low surface area and low power consumption.

SUMMARY

It is an aim of embodiments of the present description to at least partially address one or more needs in the prior art.

According to one aspect, there is provided a digital delay locked loop comprising: first and second digitally controllable delay lines coupled in series with each other, each comprising a lead portion and a lag portion, the first digitally controllable delay line receiving a reference timing signal and the second digitally controllable delay line outputting a delayed timing signal; and a time to digital converter configured to evaluate a phase difference between the reference signal and the delayed timing signal and to generate a first control signal for controlling said lead portions or a second control signal for controlling said lag portions based on the sign and magnitude of the phase difference.

According to one embodiment, the lead portions of the first and second digitally controllable delay lines each comprise a plurality of delay elements, and the time to digital converter comprises a corresponding first plurality of delay elements; and the lag portions of the first and second digitally controllable delay lines each comprise a plurality of delay elements, and the time to digital converter comprises a corresponding second plurality of delay elements.

According to one embodiment, each of the plurality of delay elements of the lead portions is implemented by a circuit similar to the one implementing each delay element of the first plurality, and each of the plurality of delay elements of the lag portions is implemented by a circuit similar to the one implementing each delay element of the second plurality.

According to one embodiment, the time to digital converter further comprises a selector circuit configured to generate: a first pair of timing signals if the phase of the reference signal leads that of the delayed timing signal, a first signal of the first pair comprising a timing edge that leads a timing edge of a second signal of the first pair by said phase difference; and a second pair of timing signals if the phase of the reference signal lags that of the delayed timing signal, a first signal of the second pair comprising a timing edge that leads a timing edge of a second signal of the second pair by said phase difference.

According to one embodiment, the time to digital converter comprises: a lead time to digital converter comprising a first delay line formed of a first plurality of delay elements each having an output coupled to an input of a corresponding one of a first plurality of flip-flops, the first signal of the first pair of timing signals being provided to an input of the first delay line, and the first plurality of flip-flops are clocked by the second signal of the first pair of timing signals; and a lag time to digital converter comprising a second delay line formed of a second plurality of delay elements each having an output coupled to an input of a corresponding one of a second plurality of flip-flops, the first signal of the second pair of timing signals being provided to an input of the second delay line, and the second plurality of flip-flops being clocked by the second signal of the second pair of timing signals.

According to one embodiment, the first plurality of flip-flops is configured to generate a first digital signal represented by thermometer code, the time to digital converter further comprising a first decoder configured to encode the first digital signal based on one-hot encoding; and the second plurality of flip-flops is configured to generate a second digital signal represented by thermometer code, the time to digital converter further comprising a second decoder configured to encode the second digital signal based on one-hot encoding.

According to one embodiment, the time to digital converter further comprises an inverter for inverting the delayed timing signal.

According to a further aspect, there is provided a method of controlling a digital delay locked loop comprising: evaluating a phase difference between the reference signal and a delayed timing signal generated by first and second digitally controllable delay lines coupled in series with each other, each comprising a lead portion and a lag portion, the first digitally controllable delay line receiving a reference timing signal and the second digitally controllable delay line outputting a delayed timing signal; generating a first control signal for controlling said lead portions or a second control signal for controlling said lag portions based on the sign and magnitude of the phase difference.

According to one embodiment, the method further comprises generating: a first pair of timing signals if the phase of the reference signal leads that of the delayed timing signal, a first signal of the first pair comprising a timing edge that leads a timing edge of a second signal of the first pair by said phase difference; and a second pair of timing signals if the phase of the reference signal lags that of the delayed timing signal, a first signal of the second pair comprising a timing edge that leads a timing edge of a second signal of the second pair by said phase difference.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION OF THE PRESENT EMBODIMENTS

Throughout the present disclosure the term "connected" is used to designate a direct connection between circuit elements, whereas the term "coupled" is used to designate a connection between elements that may be direct, or may be via one or more intermediate elements such as buffers, capacitors etc.

Figure 1:
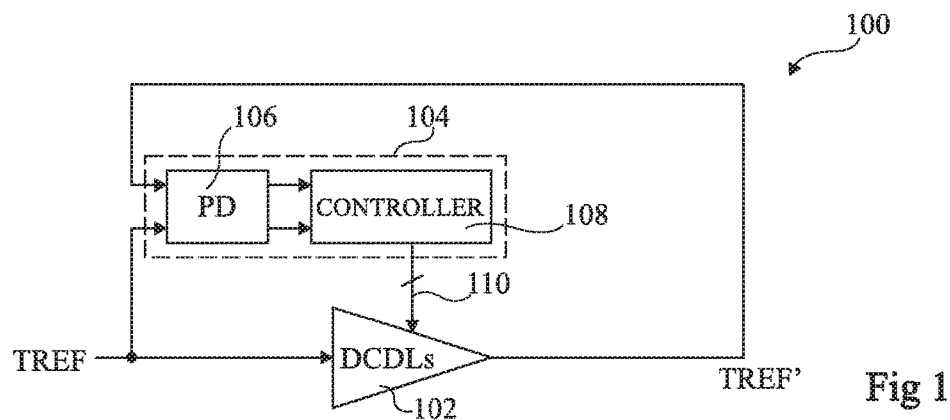
FIG. 1 schematically illustrates a typical example of a delay locked loop.

FIG. 1 illustrates a typical example of a DLL 100. A reference signal TREF is provided to digitally controllable delay lines (DCDLs) 102 to generate the delayed version TREF' of the reference signal. The reference signal TREF and the delayed signal TREF' are provided to a control circuit 104, comprising a phase detector (PD) 106 and a controller (CONTROLLER) 108. The phase detector 106 compares the phases of the signals TREF and TREF', and provides output signals to the controller 108. The controller 108 generates appropriate digital control signals on output lines 110 to the digitally controllable delay lines 102.

As described above in the background section, there is a technical difficulty in providing a circuit of relatively low complexity and surface area for converting a phase difference between the reference signal TREF and the delayed reference signal TREF' detected by the phase detector 106 into appropriate digital control signals for controlling the delay lines 102.

Figure 2:
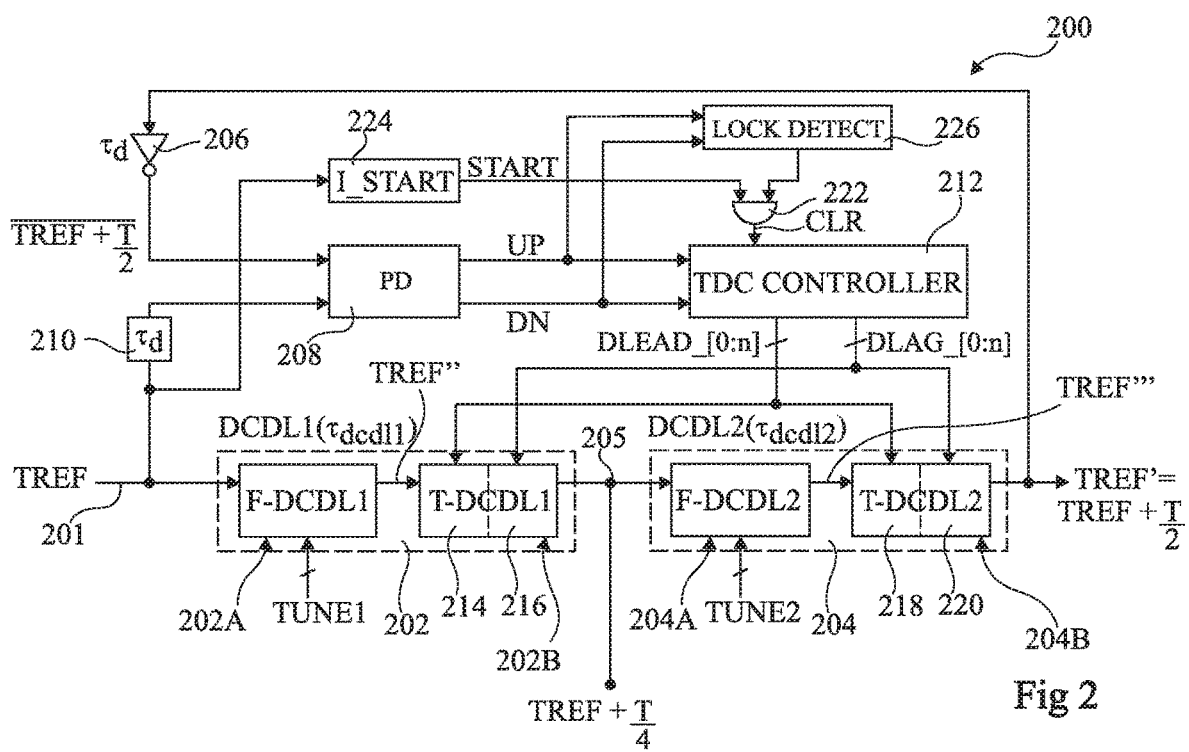
FIG. 2 schematically illustrates a digital delay locked loop according to an example embodiment of the present disclosure.

FIG. 2 schematically illustrates a delay locked loop 200 according to an example embodiment of the present disclosure.

The DLL 200 comprises a digitally controllable delay line (DCDL1) 202 introducing a time delay $\tau_{dcdl1}$, and a digitally controllable delay line (DCDL2) 204 introducing a time delay $\tau_{dcdl2}$, the DCDLs 202 and 204 being coupled in series with each other. A reference signal TREF is provided on an input line 201 of the DCDL 202. An output line of the DCDL 202 is coupled to an intermediate node 205, which is in turn coupled to an input line of the DCDL 204. The time delays $\tau_{dcdl1}$ and $\tau_{dcdl2}$ introduced by the DCDLs 202 and 204 are for example equal, and are for example chosen such that $\tau_{dcdl1}+\tau_{dcdl2}=T/2$, where T is the period of the reference signal TREF. The signal at the intermediate node 205 thus corresponds to the reference signal TREF delayed by a quarter period T/4.

More generally, as described in more detail below, the DLLs described herein are for example configured to apply any desired phase shift to the reference signal TREF, this phase shift for example being constant. In some embodiments, the total phase shift introduced by the delay line is equal to the period of the reference signal TREF, or to a fixed fraction of the period of the reference signal TREF, such that this total phase shift can be calibrated by a feedback loop based on the reference timing signal. In the example of FIG. 2, this total phase shift is equal to T/2, whereas in alternative embodiments it could be equal to T, T/4 or another fixed value.

The output line of the DCDL 204 is coupled to an inverter 206, which generates at its output an inverted signal $\overline{TREF+T/2}$. The output of the inverter 206 is coupled to one input of a phase detector (PD) 208, the other input of which is coupled to the input line 201 receiving the reference signal TREF, which in some cases is delayed, by a delay element 210, by a time $\tau T_d$ to compensate for the delay introduced by the inverter 206. The phase detector 208 compares the relative phases of the signals $\overline{TREF+T/2}$ and TREF and generates output signals UP and DN based on the magnitude and sign of the phase difference between the signals TREF and $\overline{TREF+T/2}$. The signals UP and DN are provided to a TDC (time to digital converter) controller (TDC CONTROLLER) 212.

The TDC controller 212 generates digital tuning signals DLEAD_[0:n] and DLAG_[0:n] on output lines coupled to the DCDLs 202 and 204. For example, the DCDL 202 comprises a fixed DCDL (F-DCDL1) 202A, coupled in series with a tunable DCDL (T-DCDL1) 202B, and the DCDL 204 comprises a fixed DCDL (F-DCDL2) 204A, coupled in series with a tunable DCDL (T-DCDL2) 204B. The fixed DCDLs 202A, 204A are not tunable by the TDC controller 212, but in the embodiment of FIG. 2 they are tunable by control signals TUNE1 and TUNE2 to correct any mismatch between the DCDLs 202 and 204. The signals TUNE1 and TUNE2 are for example generated by appropriate control circuitry (not illustrated). The tunable DCDLs 202B and 204B each introduce a delay that is tuned by the digital signals DLEAD_[0:n] and DLAG_[0:n] from the TDC controller 212. For example, the tunable DCDL 202B comprises a lead portion 214 controlled by the signal DLEAD_[0:n] and a lag portion 216 controlled by the signal DLAG_[0:n]. Similarly, the tunable DCDL 204B for example comprises a lead portion 218 controlled by the signal DLEAD_[0:n] and a lag portion 220 controlled by the signal DLAG_[0:n].

The TDC controller 212 is for example disabled by the low state of a clear signal CLR generated by an AND gate 222. The AND gate 222 for example has one of its inputs coupled to the output of a start circuit (I_START) 224, which has an input coupled to the input line 201, and which generates on its output line a signal START that goes high only a certain time after the start of the reference signal TREF. This prevents unstable behavior of the control loop until the operation of the DCDLs has stabilized. The other input of the AND gate 222 is coupled to a lock detection circuit (LOCK DETECT) 226, which in turn has inputs coupled to the output lines of the phase detector 208. The lock detection circuit 226 outputs a high signal unless it determines, based on the signals UP and DN from the phase detector 208, that the delay introduced by the DCDLs has converged to the target level, in which case it outputs a low signal that disables the TDC controller 212.

Figure 3A:
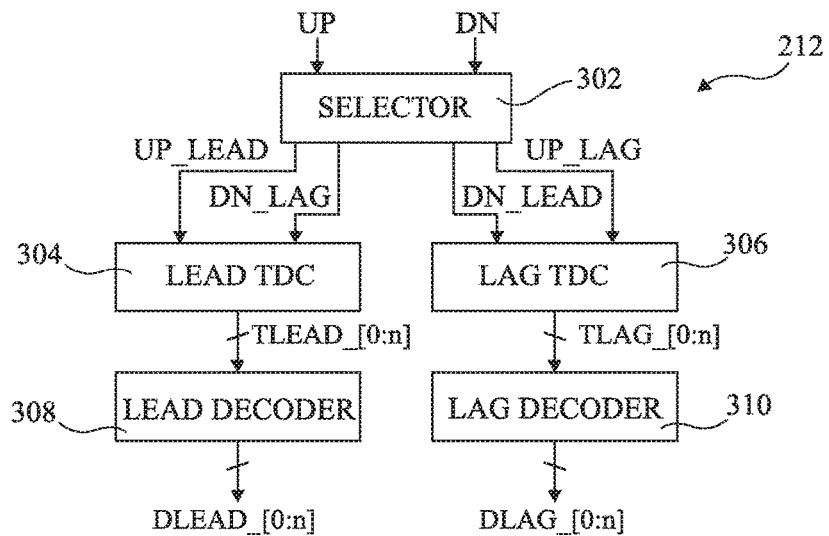
FIG. 3A schematically illustrates a TDC controller of the DLL of FIG. 2 in more detail according to an example embodiment.

FIG. 3A schematically illustrates the TDC controller 212 in more detail according to an example embodiment. The controller 212 for example comprises a selector circuit (SELECTOR) 302, which receives the signals UP and DN from the phase detector 208, and generates four output signals UP_LEAD, DN_LAG, DN_LEAD and UP_LAG. The TDC controller 212 further comprises a lead TDC circuit (LEAD TDC) 304 and a lag TDC circuit (LAG TDC) 306. The lead TDC circuit 304 receives the signals UP_LEAD and DN_LAG, and converts the time information represented by these signals into a digital signal TLEAD_[0:n]. The lag TDC circuit 306 receives the signals DN_LEAD and UP_LAG, and converts the time information represented by these signals into a digital signal TLAG_[0:n]. In the embodiment of FIG. 3A, the TDC controller 212 further comprises a lead decoder (LEAD DECODER) 308 and a lag decoder (LAG DECODER) 310 for respectively converting the digital signals TLEAD_[0:n], TLAG_[0:n] into the digital signals DLEAD_[0:n], DLAG_[0:n].

Figure 3B:
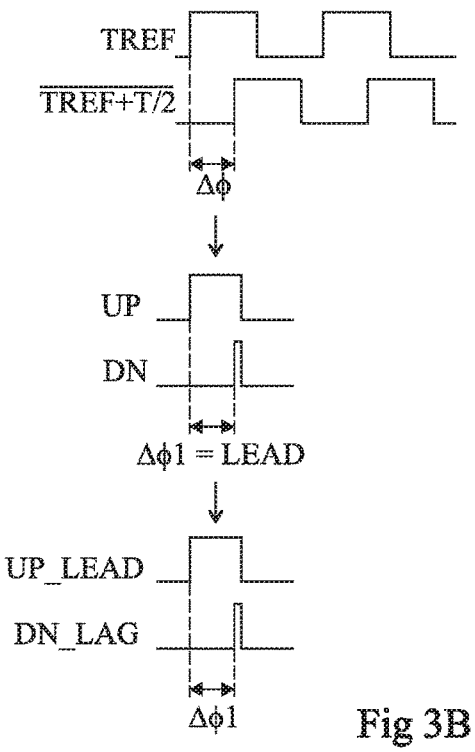
FIGS. 3B and 3C are timing diagrams representing the operation of a selector circuit of FIG. 3A according to an example embodiment.
Figure 3C:
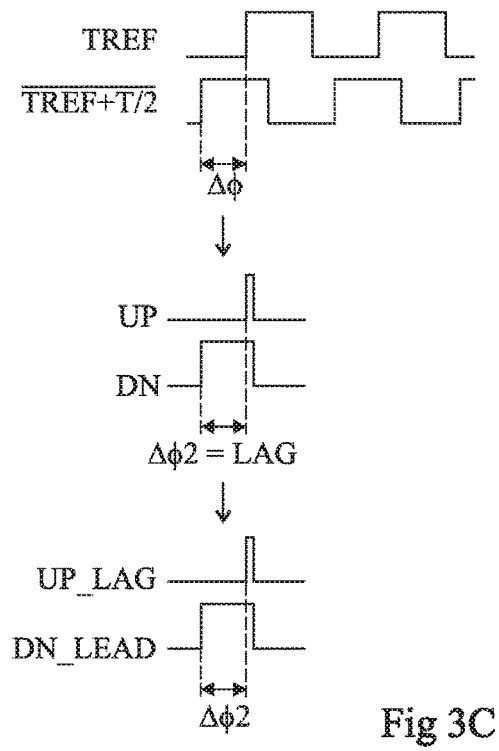

FIGS. 3B and 3C are timing diagrams representing the generation of the signals UP_LEAD, DN_LAG, DN_LEAD and UP_LAG by the selector circuit 302 of FIG. 3A according to an example embodiment.

FIG. 3B illustrates an example in which the signal TREF leads the signal $\overline{TREF+T/2}$ by a phase difference $\Delta\phi$. In this case, the signal UP is asserted first, a fixed time after the rising edge of the signal TREF. The signal DN is asserted a fixed time after the rising edge of the signal $\overline{TREF+T/2}$. Once both the signals UP and DN are high, they are reset after a minimum logic delay inside the phase detector 208. The delay between the rising edges of the signals UP and DN represents a lead phase error $\Delta\phi1$.

FIG. 3C illustrates an opposite example in which the signal TREF lags behind the signal $\overline{TREF+T/2}$ by a phase difference $\Delta\phi$. In this case, the signal DN is asserted first, a fixed time after the rising edge of the signal $\overline{TREF+T/2}$. The signal UP is asserted a fixed time after the rising edge of the signal TREF. Once both the signals UP and DN are high, they are reset after a minimum logic delay inside the phase detector 208. The delay between the rising edges of the signals DN and UP represents a lag phase error $\Delta\phi2$.

Figure 3D:
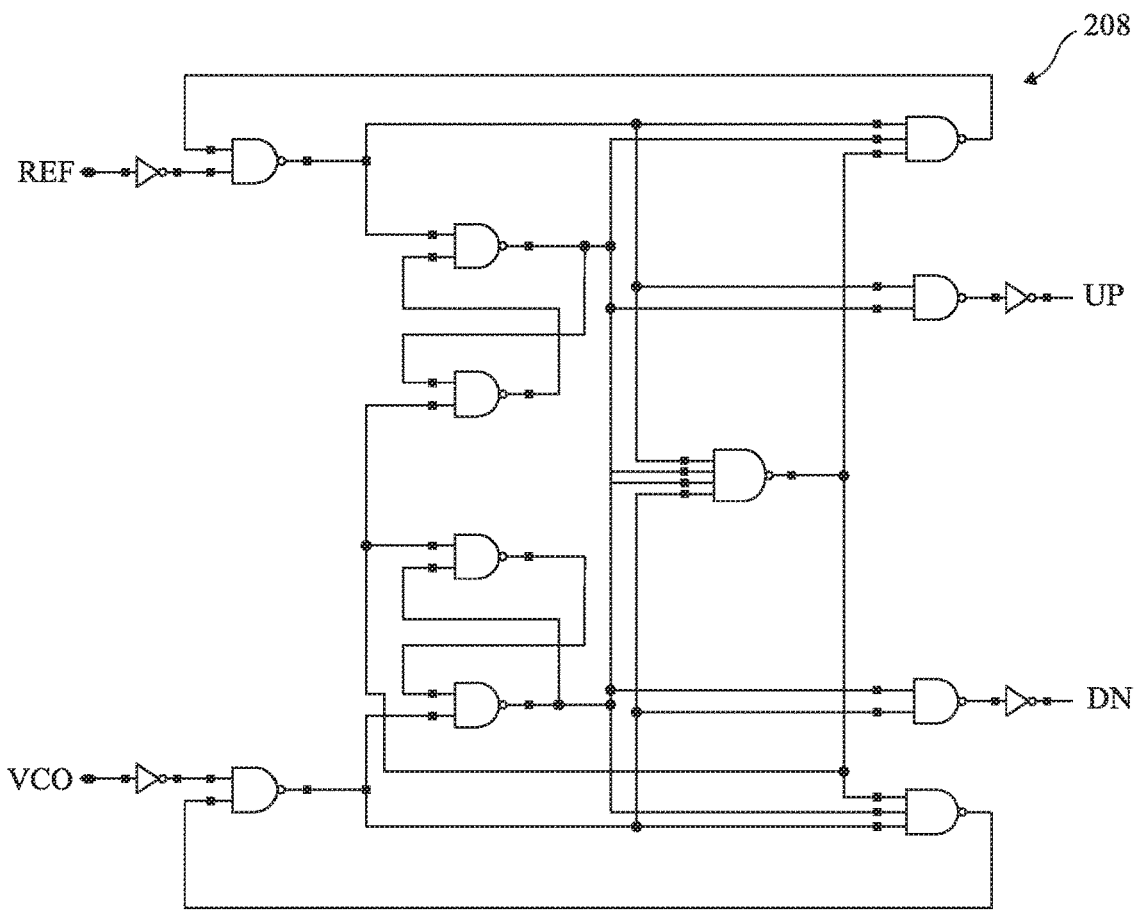
FIG. 3D schematically illustrates a phase detector of the DLL of FIG. 2 in more detail according to an example embodiment.

Thus the selector circuit 302 generates either the signals UP_LEAD and DN_LAG in which the rising edge of the signal UP_LEAD always leads the rising edge of the signal DN_LAG by the phase difference, or the signals UP_LAG and DN_LEAD in which the rising edge of the signal DN_LEAD always leads the rising edge of the signal UP_LAG by the phase difference, FIG. 3D schematically illustrates the phase detector 208 of FIG. 2 in more detail according to an example embodiment. It will be apparent to those skilled in the art that the circuit of FIG. 3D is just one example of the implementation of the phase detector 208, and that many variations would be possible.

Figure 4:
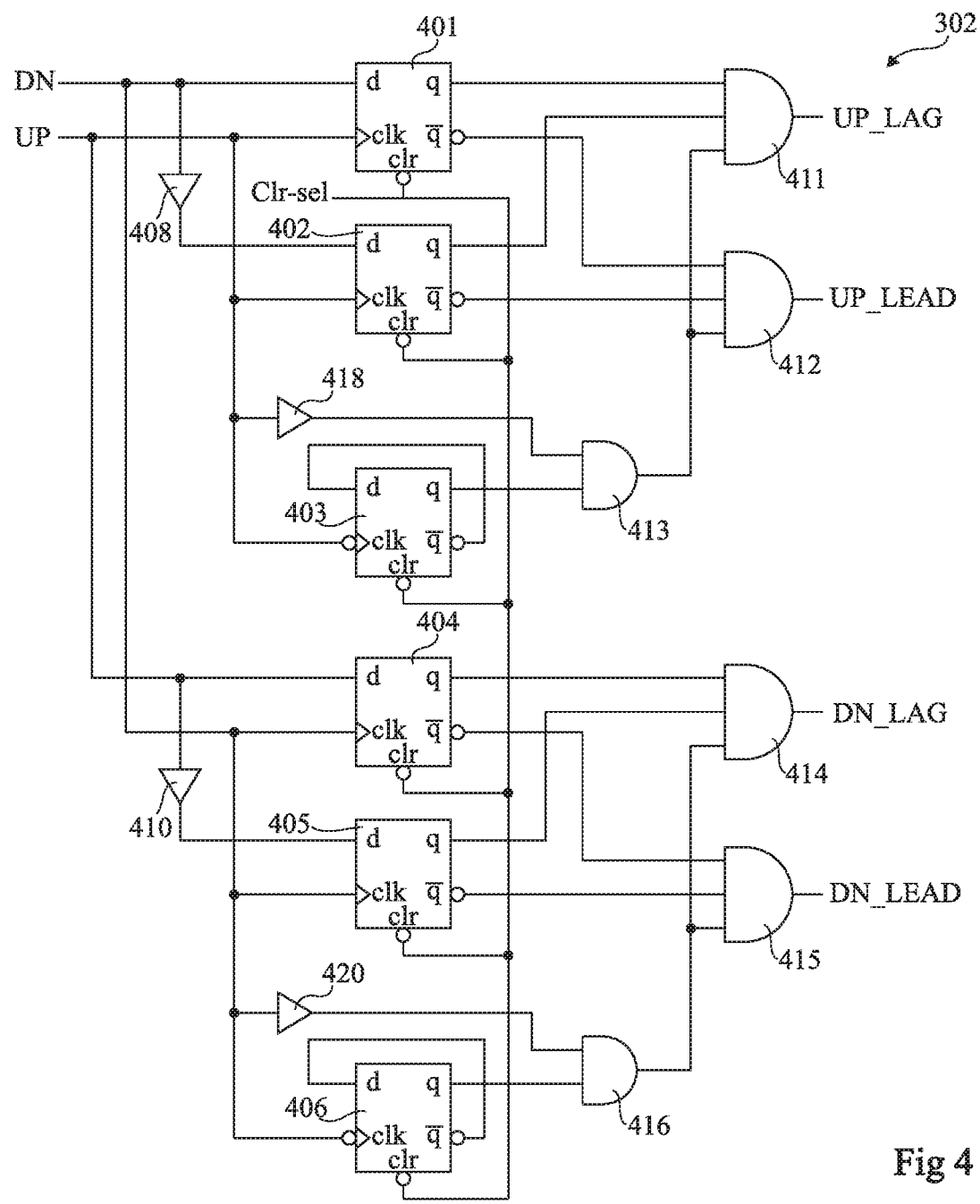
FIG. 4 schematically illustrates the selector circuit of FIG. 3A in more detail according to an example embodiment.

FIG. 4 schematically illustrates an example implementation of the selector circuit 302. The selector circuit 302 for example comprises six flip-flops 401 to 406. The flip-flops 401 and 402 are clocked by the signal UP, the flip-flop 403 is clocked by the inverse of the signal UP, the flip-flops 404 and 405 are clocked by the signal DN, and the flip-flop 406 is clocked by the inverse of the signal DN. The flip-flop 401 has its data input d coupled to receive the signal DN, and the flip-flop 402 has its data input d coupled to receive the signal DN after a delay introduced by a buffer 408. The flip-flop 403 has its data input d coupled to its inverted output $\bar{q}$. Similarly, the flip-flop 404 has its data input d coupled to receive the signal UP, and the flip-flop 405 has its data input d coupled to receive the signal UP after a delay introduced by a buffer 410. The flip-flop 406 has its data input d coupled to its inverted output $\bar{q}$.

The selector circuit 302 for example further comprises six AND gates 411 to 416. The AND gate 411 is a 3-input AND gate having its respective inputs coupled to the q outputs of the flip-flops 401 and 402 and to the output of the AND gate 413. The AND gate 412 is also a 3-input AND gate having its respective inputs coupled to the inverted outputs $\bar{q}$ of the flip-flops 401, 402 and to the output of the AND gate 413. The AND gate 413 has one input coupled to the output of a buffer 418 receiving the signal UP, and its other input coupled to the q output of the flip-flop 403.

Similarly, the AND gate 414 is a 3-input AND gate having its respective inputs coupled to the q outputs of the flip-flops 404 and 405 and to the output of the AND gate 416. The AND gate 415 is also a 3-input AND gate having its respective inputs coupled to the inverted outputs $\bar{q}$ of the flip-flops 404, 405 and to the output of the AND gate 416. The AND gate 416 has one input coupled to the output of a buffer 420 receiving the signal DN, and its other input coupled to the q output of the flip-flop 406.

The AND gates 411, 412, 414 and 415 respectively provide at their outputs the signals UP_LAG, UP_LEAD, DN_LAG and DN_LEAD.

Figure 5:
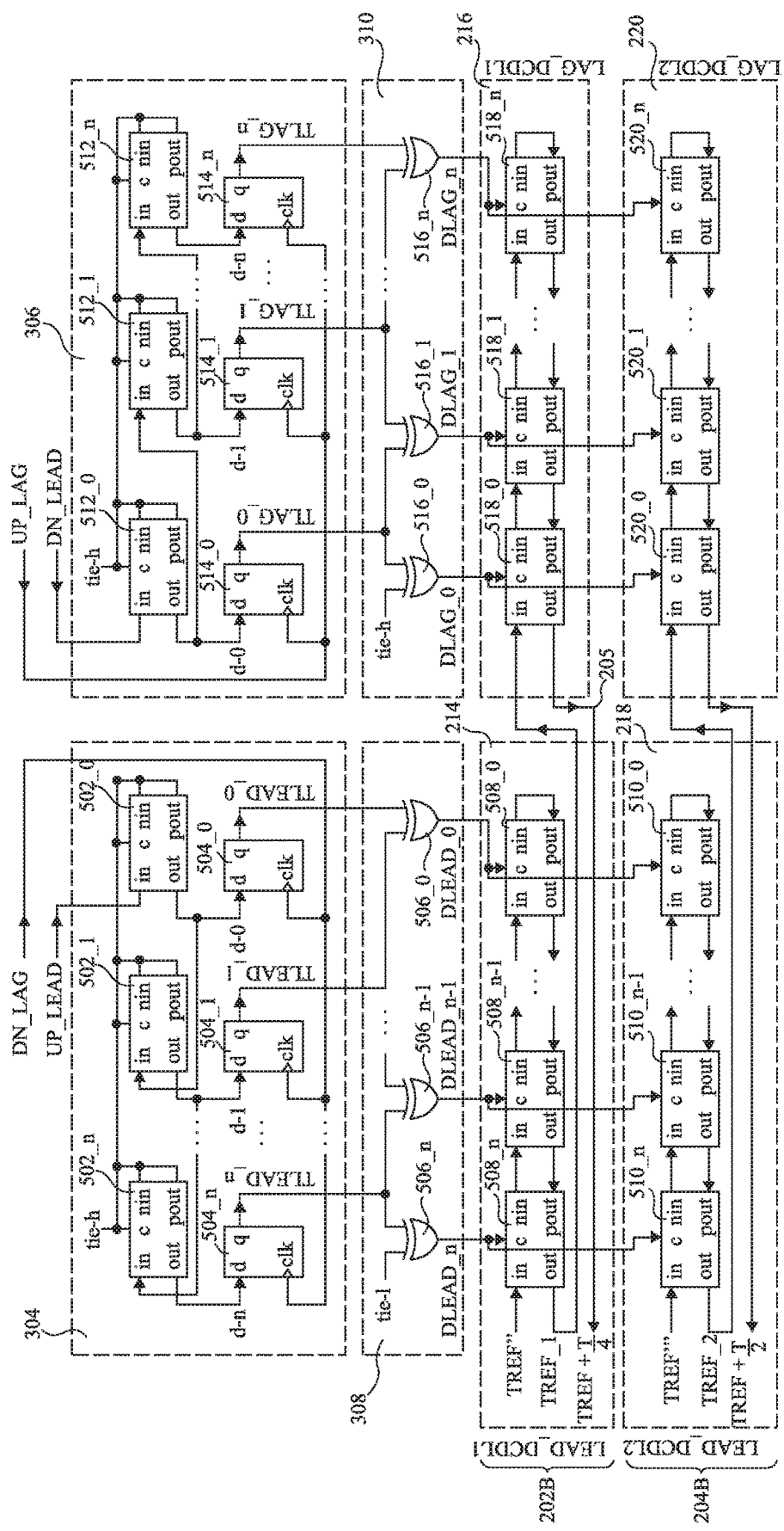
FIG. 5 schematically illustrates time to digital converters, decoders and digitally controllable delay lines of the DLL of FIG. 2 in more detail according to an example embodiment.

FIG. 5 schematically illustrates the lead and lag TDCs 304, 306 and the lead and lag decoders 308, 310 of the TDC controller 212, and the tunable DCDLs 202B and 204B, in more detail according to an example embodiment of the present disclosure.

The lead TDC 304 for example comprises delay elements 502_0 to 502_n and flip-flops 504_0 to 504_n. Each delay element 502_0 to 502_n for example comprises an input in and an output out, and the delay elements 502_0 to 502_n are for example coupled in series via these inputs and outputs. Each delay element 502_0 to 502_n for example further comprises an output nin, a control input c and further input pout, which are all for example tied to a logic high level tie-h. The delay element 502_0 for example receives at its input the signal UP_LEAD. The output of each delay element 502_0 to 502_n is respectively coupled to a data input d of the corresponding flip-flop 504_0 to 504_n. The flip-flops 504_0 to 504_n are for example clocked by the signal DN_LAG. The q outputs of the flip-flops 504_0 to 504_n respectively provide the bits TLEAD_0 to TLEAD_n of the digital signal TLEAD_[0:n] at the output of the lead TDC 304.

The lead decoder 308 for example comprises exclusive OR gates 506_0 to 506_n each having one of its inputs coupled to the output of the corresponding flip-flop 504_0 to 504_n, and its other input coupled to the output of the next flip-flop in the chain. The other input of the exclusive OR gate 506_n is for example tied to a logic low level tie-l. The exclusive OR gates 506_0 to 506_n respectively provide the digital signals DLEAD_0 to DLEAD_n.

As described above, the tunable DCDL 202B comprises the lead portion (LEAD_DCDL1) 214 and the lag portion (LAG_DCDL1) 216, and the tunable DCDL 204B also comprises a lead portion (LEAD_DCDL2) 218 and a lag portion (LAG_DCDL2) 220.

The lead portions 214 and 218 for example comprise delay elements 508_0 to 508_n and 510_0 to 510_n respectively, each of these delay elements having a control input c coupled to receive the corresponding digital signal DLEAD_0 to DLEAD_n. The delay elements 508_0 to 508_n and 510_0 to 510_n each further comprise inputs in and pout, and outputs out and nin. The delay elements 508_0 to 508_n are for example coupled in series via their outputs out and inputs pout and also by their outputs nin and inputs in. Similarly, the delay elements 510_0 to 510_n are for example coupled in series via their outputs out and inputs pout and also by their outputs nin and inputs in. The delay elements 508_0 and 510_0 each for example has its output nin coupled to its input pout. The element 508_n for example has its input in coupled to receive the reference signal TREF" at the output of the fixed DCDL 202A of FIG. 2. The output out of the delay element 508_n provides an intermediate signal TREF_1, which is provided to the lag portion 216. The delay element 510_n for example has its input in coupled to receive the reference signal TREF" at the output of the fixed DCDL 204A of FIG. 2. The output out of the delay element 510_n provides an intermediate signal TREF_2, which is provided to the lag portion 220.

The lag TDC 306 for example comprises delay elements 512_0 to 512_n and flip-flops 514_0 to 514_n. Each delay element 512_0 to 512_n for example comprises an input in and an output out, and the delay elements 512_0 to 512_n are for example coupled in series via these inputs and outputs. Each delay element 512_0 to 512_n for example further comprises an output nin, a control input c and further input pout, which are all for example tied to a logic high level tie-h. The delay element 512_0 for example receives at its input the signal DN_LEAD. The output of each delay element 512_0 to 512_n is respectively coupled to a data input d of the corresponding flip-flop 514_0 to 514_n. The flip-flops 514_0 to 514_n are for example clocked by the signal UP_LAG. The q outputs of the flip-flops 514_0 to 514_n respectively provide the bits TLAG_0 to TLAG_n of the digital signal TLAG_[0:n] at the output of the lag TDC 306.

The lag decoder 310 for example comprises exclusive OR gates 516_0 to 516_n each having one of its inputs coupled to the output of the corresponding flip-flop 514_0 to 514_n, and its other input coupled to the output of the previous flip-flop in the chain. The other input of the exclusive OR gate 516_0 is for example tied to a logic high level tie-h. The exclusive OR gates 516_0 to 516_n respectively provide the digital signals DLAG_0 to DLAG_n.

The lag portions 216 and 220 for example comprise delay elements 518_0 to 518_n and 520_0 to 520_n respectively, each of these delay elements having a control input c coupled to receive the corresponding digital signal DLAG_0 to DLAG_n. The delay elements 518_0 to 518_n and 520_0 to 520_n each further comprises inputs in and pout, and outputs out and nin. The delay elements 518_0 to 518_n are for example coupled in series via their outputs out and inputs pout and also by their outputs nin and inputs in. Similarly, the delay elements 520_0 to 520_n are for example coupled in series via their outputs out and inputs pout and also by their outputs nin and inputs in. The delay element 518_n and 520_n each for example has its output nin coupled to its input pout. The element 518_0 for example has its input in coupled to receive the intermediate reference signal TREF_1 at the output of the lead portion 214. The output out of the delay element 518_0 provides the intermediate signal TREF+T/4, which is provided to the input of the fixed DCDL 204A. The delay element 520_0 for example has its input in coupled to receive the intermediate signal TREF_2 at the output of the lead portion 218. The output out of the delay element 520_0 provides the output signal TREF+T/2 of the delay lines.

Operation of the circuits of FIGS. 2, 3A and 5 will now be described in more detail with reference to FIGS. 6A and 6B.

Figure 6A:
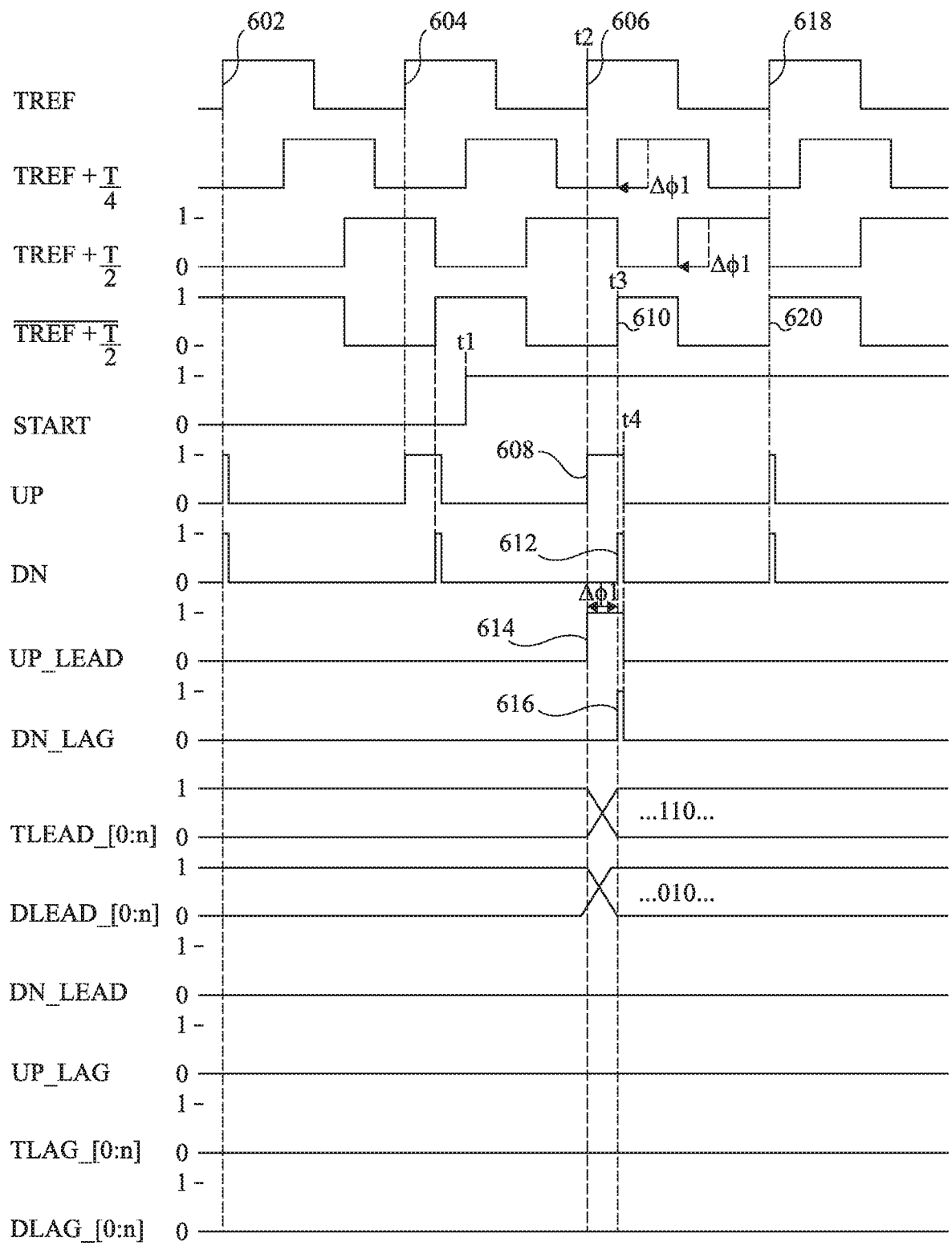
FIGS. 6A and 6B are timing diagrams illustrating an example of signals in the DLL of FIG. 2 according to an example embodiment.
Figure 6B:
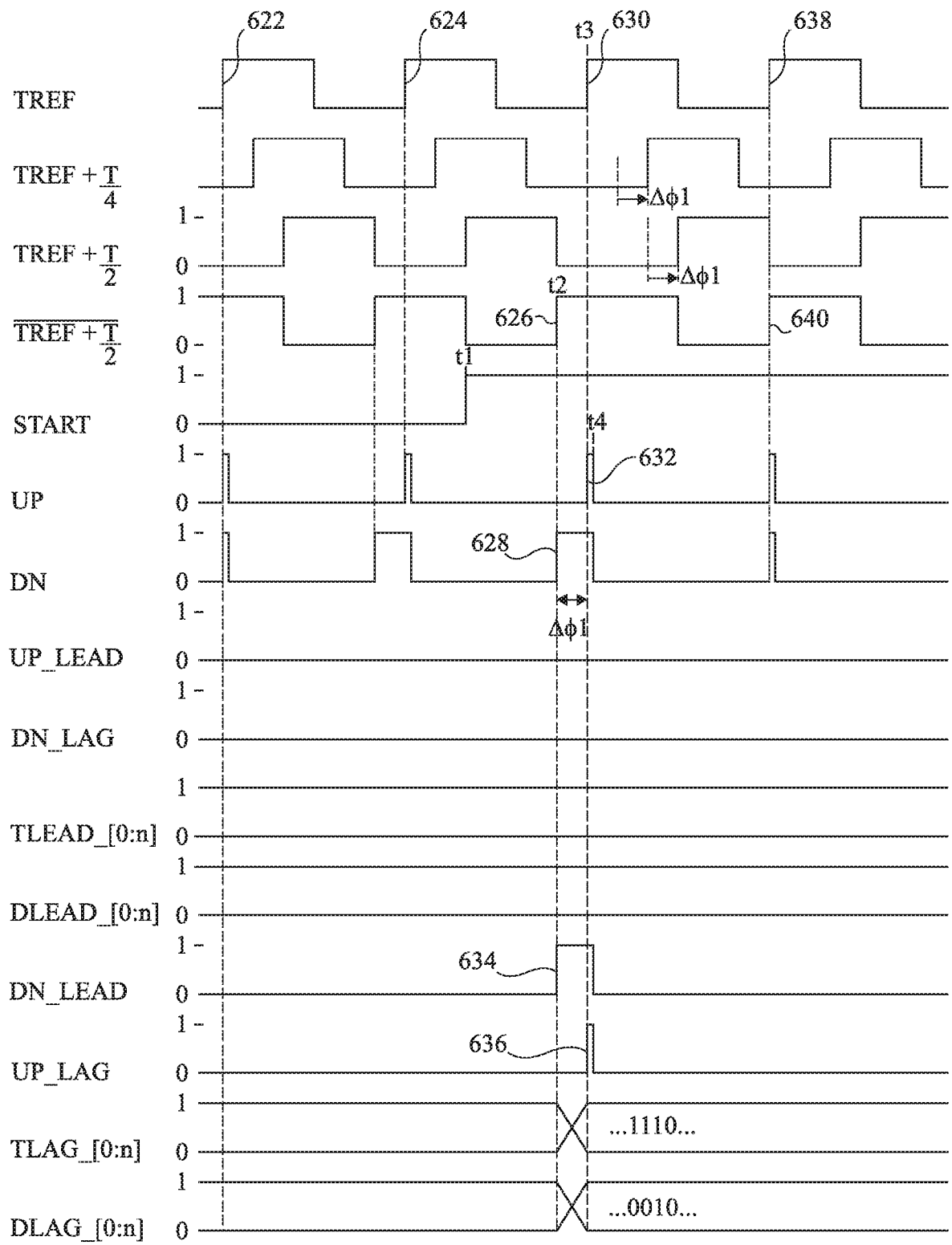

FIGS. 6A and 6B are timing diagrams each showing examples of the signals TREF, TREF+T/4, TREF+T/2, $\overline{\text{TREF+T/2}}$, START, UP, DN, UP_LEAD, DN_LAG, TLEAD_[0:n], DLEAD[0:n], DN_LEAD, UP_LAG, TLAG_[0:n] and DLAG_[0:n].

FIG. 6A illustrates an example in which rising edges of the signal TREF initially lead the rising edges of the signal TREF+T/2.

During First rising edges 602 and 604 of the reference signal TREF, the signal START generated by the circuit 224 of FIG. 2 is low, and thus the TDC controller 212 is not yet active. Therefore, while phase detector 208 starts to generate pulses in the signals UP and DN, the output signals of the selector circuit 302 remain low.

At a time t1, the signal START goes high, and then at a time t2, a subsequent rising edge 606 of the reference signal TREF is taken into account by the TDC controller 212. In particular, the signal UP has a rising edge 608 shortly after the rising edge 606. At a time t3, the signal $\overline{\text{TREF+T/2}}$ has a rising edge 610, and the signal DN thus has as a rising edge 612 shortly thereafter. In view of the fact that the signal UP leads the signal DN, the signal UP_LEAD has a rising edge 614 shortly after the rising edge 608, and the signal DN_LAG has a rising edge 616 shortly after the rising edge 612. The signals UP, DN, UP_LEAD and DN_LAG all go low at a time t4. For example, when both the signals UP and DN are high, they are automatically reset by an AND gate in the phase detector 208, and the signals UP_LEAD and DN_LAG follow the signals UP and DN respectively.

The signal TLEAD[0:n] is generated based on the phase difference Δϕ1 between the rising edges 614 and 616 of the signals UP_LEAD and DN_LAG respectively, and the signal DLEAD_[0:n] is also generated, such that shortly after the rising edge 616 of the signal DN_LAG, the delays introduced by the lead portions of the DCDLs 202B and 204B are reduced. A subsequent rising edge 618 of the reference signal TREF is thus for example aligned with a rising edge 620 of the signal $\overline{\text{TREF+T/2}}$.

FIG. 6B illustrates an example in which rising edges of the signal TREF initially lag behind the rising edges of the signal $\overline{\text{TREF+T/2}}$.

During first rising edges 622 and 624 of the reference signal TREF, the signal START generated by the circuit 224 of FIG. 2 is low, and thus the TDC controller 212 is not yet active. Therefore, while phase detector 208 starts to generate pulses in the signals UP and DN, the output signals of the selector circuit 302 remain low.

At a time t1, the signal START goes high, and then at a time t2, a rising edge of the signal $\overline{\text{TREF+T/2}}$ is taken into account by the TDC controller 212. In particular, the signal DN has a rising edge 628 shortly after the rising edge 626. At a time t3, the reference signal TREF has a rising edge 630, and the signal UP thus has as a rising edge 632 shortly thereafter. In view of the fact that the signal DN leads the signal UP, the signal DN_LEAD has rising edge 634 shortly after the rising edge 628, and the signal UP_LAG has a rising edge 636 shortly after the rising edge 632. The signals UP, DN, DN_LEAD and UP_LAG all go low at a time t4.

The signal TLAG[0:n] is generated based on the phase difference $\Delta\phi1$ between the rising edges 634 and 636 of the signals DN_LEAD and UP_LAG respectively, and the signal DLAG_[0:n] is also generated, such that shortly after the rising edge 636 of the signal UP_LAG, the delays introduced by the lag portions of the DCDLs 202B and 204B are increased. A subsequent rising edge 638 of the reference signal TREF is thus for example aligned with a rising edge 640 of the signal $\overline{\text{TREF}+T/2}$.

Figure 7A:
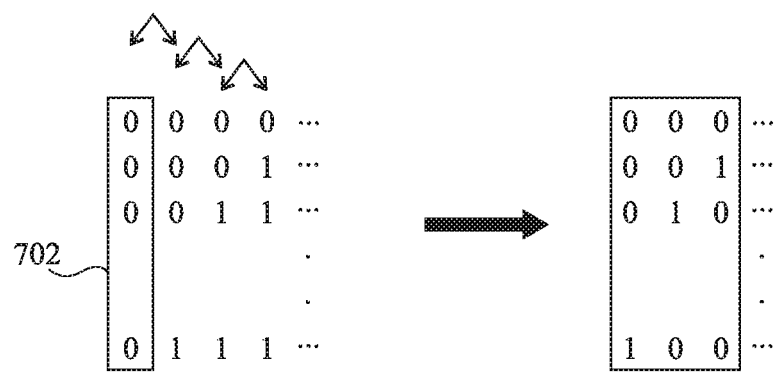
FIGS. 7A and 7B represent coding schemes of delay line control signals according to an example embodiment.
Figure 7B:
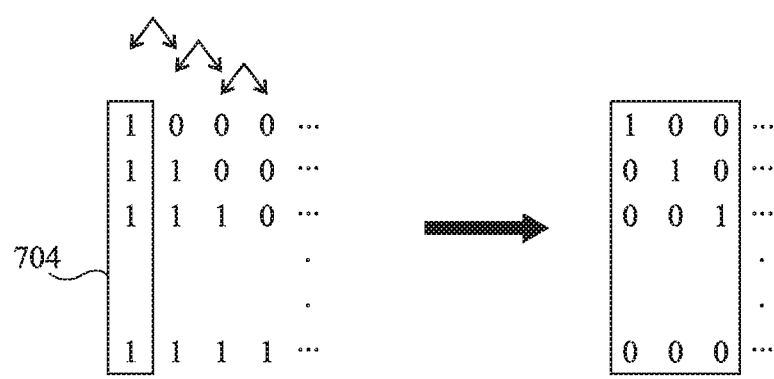

FIGS. 7A and 7B represent an example of decoding of the thermometer code into one-hot encoding as performed by the decoders 308 and 310 of FIG. 3A. The lead and lag TDCs 304 and 306 for example generate inverted forms of thermometer encoding from each other, and the transformation is thus different.

FIG. 7A represents the thermometer coding generated by the lead TDC 304 in which the code goes from a value of "000 . . . 00" to a value of "111 . . . 11" with the "1" values replacing the "0" values from the right. The addition of a "0" on the left by the value tie-l in FIG. 5 and represented by a block 702 in FIG. 7A implies that the one-hot coding increments from "000 . . . 00" to "000 . . . 01" to "000 . . . 10", etc. up to a value of "100 . . . 00". Thus the lead portions 214 and 218 of the DCDLs 202B and 204B provide a maximum delay when the signal DLEAD_[0:n] is at the default condition of "000 . . . 00", and a minimum delay when the signal DLEAD_[0:n] has reached "100 . . . 00".

FIG. 7B represents the thermometer coding generated by the lag TDC 306 in which the code goes increments from a value of "000 . . . 00" to "100 . . . 00" to "110 . . . 00" etc. up to a value of "111 . . . 11" with the "1" values replacing the "0" values from the left. The addition of a "1" on the left by the value tie-h in FIG. 5 and represented by a block 704 in FIG. 7B implies that the one-hot coding increments from a value of "100 . . . 00" to "010 . . . 00" to "001 . . . 00" and to a low value of "000 . . . 00". Thus the lag portions 216 and 220 of the DCDLs 202B and 204B provide a minimum delay when the signal DLAG_[0:n] is at the default condition of "100 . . . 00", and a maximum delay when the signal DLAG_[0:n] has reached "000 . . . 00".

Figure 8A:
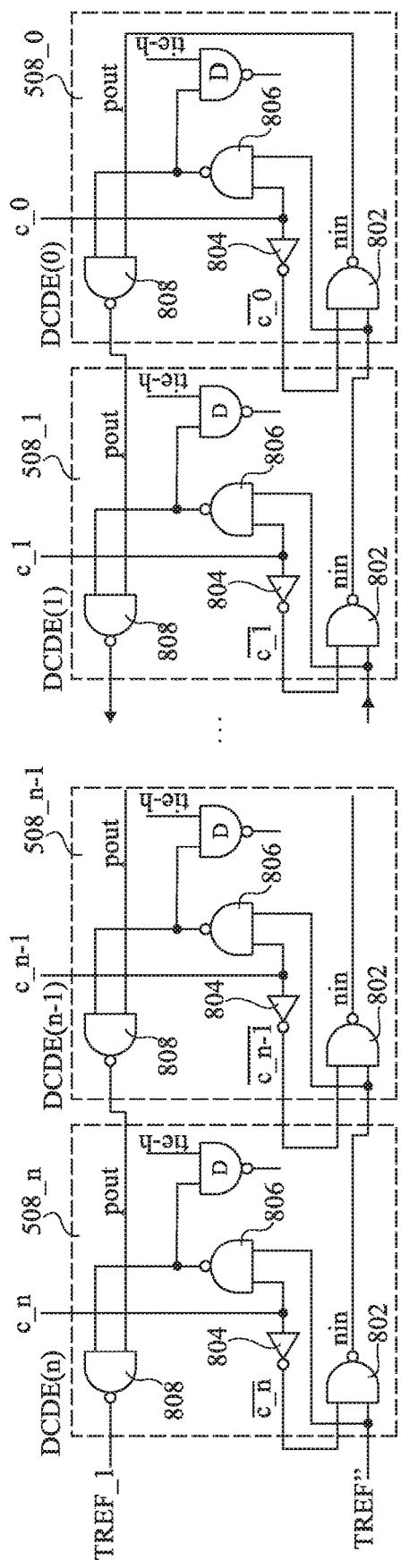
FIGS. 8A and 8B schematically illustrate DCDLs of FIG. 5 in more detail according to an example embodiment.

FIG. 8A schematically illustrate the delay elements 508_0 to 508_n of the lead portion 214 in more detail according to an example embodiment. The lead portion 218 is for example implemented in a similar fashion, and the delay elements 502_0 to 502_n of the TDC controller 212 are for example implemented by similar circuits. Indeed, each of the delay elements 508_0 to 508n and 510_0 to 510_n of the lead portions is for example implemented by a circuit identical to the one implementing each delay element 502_0 to 502_n of the TDC controller, and each of the plurality of delay elements 518_0 to 518_n, 520_0 to 520_n of the lag portions is for example implemented by a circuit identical to the one implemental each delay element 512_0 to 512_n of the TDC controller. The term "identical" for example implies that each circuit is formed of the same circuit components connected in the same way, these circuit components for example being identical in size and layout.

Each delay element 508_0 to 508_n for example comprises a NAND gate 802 having one input coupled to the input in of the delay element, and its other input receiving the control signal c_n inverted by an inverter 804. The output of the NAND gate 802 provides the output nin of the delay element. Each delay element further comprises a NAND gate 806 having one input coupled to the input in, and its other input coupled to receive the control signal c_n. The output of the NAND gate 806 is coupled to one input of a further NAND gate 808, which has its other input coupled to the input pout of the delay element. The NAND gate 808 has its output coupled to the output out of the delay element. In some embodiments a dummy NAND gate (D) is coupled to the output of the NAND gate 806 for load matching purposes.

Figure 8B:
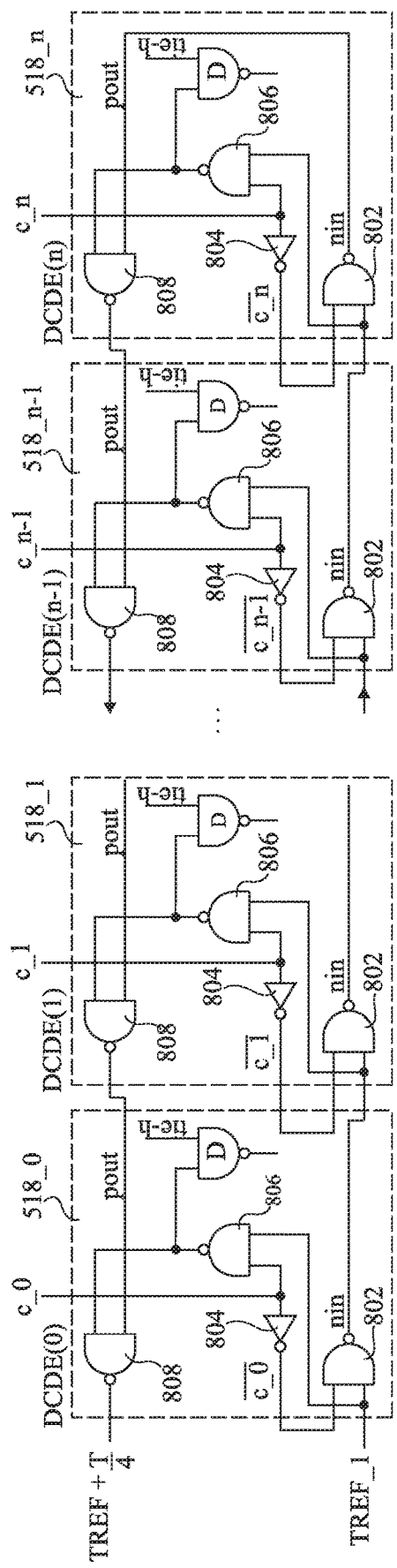

FIG. 8B schematically illustrates the delay elements 518_0 to 518_n of the lag portion 216 of the DCDL 202B in more detail according to an example embodiment. The delay elements are implemented by the same circuit as the delay elements 508_0 to 508_n, and this circuit will not be described again in detail. In some embodiments, the value of c_n of the final cell DCDE(n) is coupled to the logic high level tie-h in order to maintain default conditions.

Figure 9:
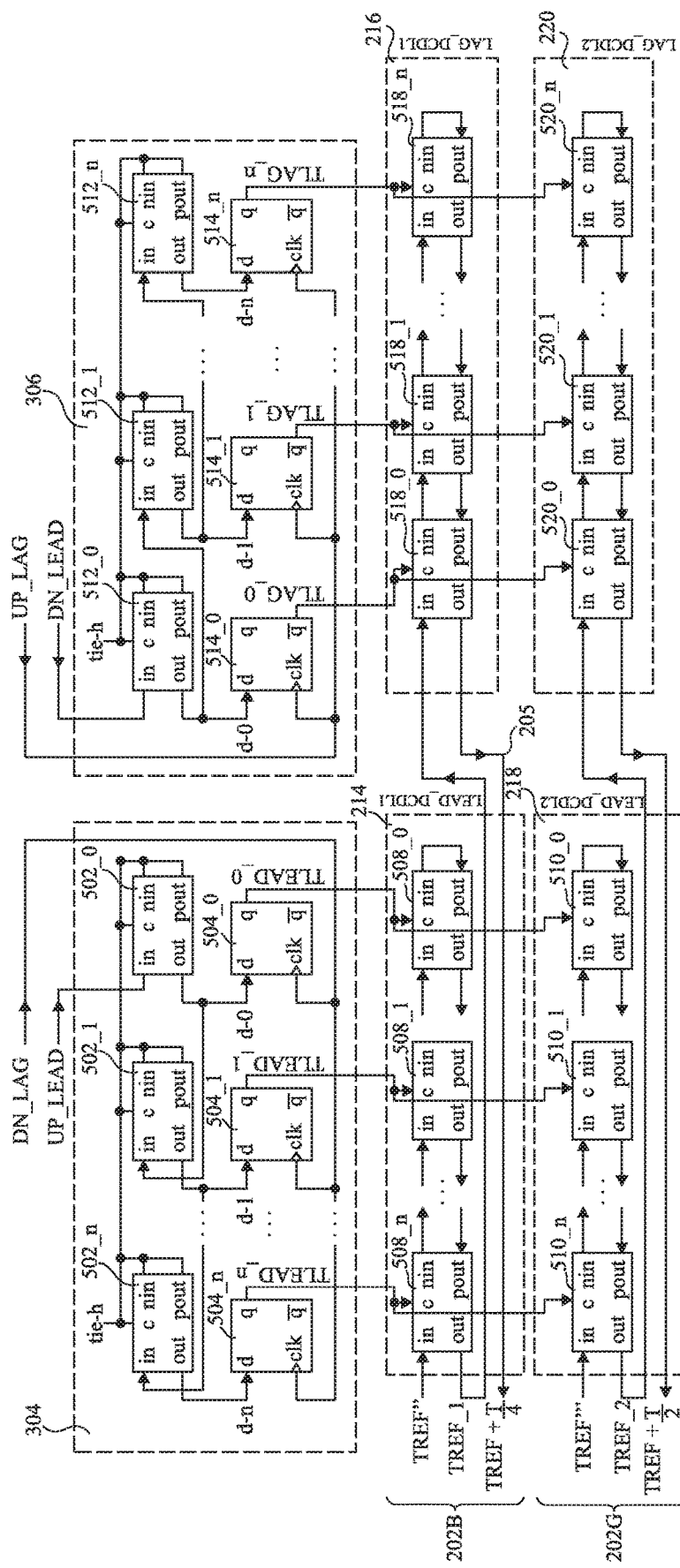
FIG. 9 schematically illustrates time delay controllers and digitally controllable delay lines of the DLL of FIG. 2 in more detail according to an alternative example to that of FIG. 5.

FIG. 9 schematically illustrates the lead and lag TDCs 304, 306 and the tunable DCDLs 202B and 204B, in more detail according to a further example embodiment similar to that of FIG. 5, but in which the lead and lag decoders 308, 310 of the TDC controller 212 have been omitted. Indeed, the signals TLEAD_0 to TLEAD_n generated by the q outputs of the flip-flops 504_0 to 504_n are coupled directly to the control inputs c of the delay elements 508_0 to 508_n and 510_0 to 510_n. The default condition of maximum delay is still maintained when the signals at the inputs of the flip-flops and thus the signals TLEAD_0 to TLEAD_n are all at "0".

However, the signals TLAG_0 to TLAG_n are for example generated by the $\bar{q}$ outputs of the flip-flops 514_0 to 514_n such that the default condition of minimum delay can be applied when the signals at the inputs of the flip-flops are at "0".

An advantage of removing the decoders 308, 310 is that it simplifies the controller, reduces chip area, and leads to reduced power consumption.

Figure 10:
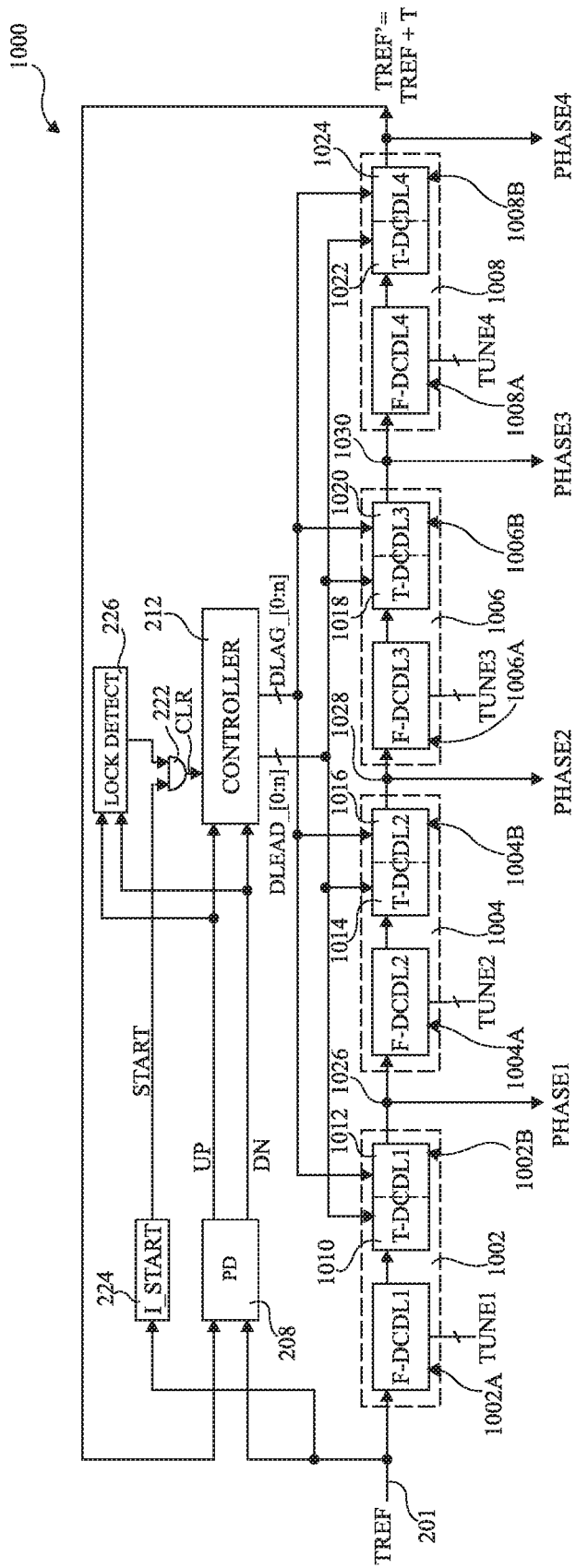
FIG. 10 illustrates a DLL according to a further example embodiment.

FIG. 10 schematically illustrates a digital DLL 1000 according to a further example embodiment. Many features of the DLL 1000 are similar to features of the DLL 200 of FIG. 2, and these features have been labelled with like reference numerals and will not be described again in detail.

In the DLL 1000 of FIG. 10, rather than there being two DCDLs that when tuned introduce a total delay of a half period, there are four DCDLs 1002, 1004, 1006 and 1008 that when tuned introduce a total delay equal to a full period of the reference signal TREF. Each DCDL 1002 to 1008 for example comprises a fixed DCDL 1002A, 1004A, 1006A and 1008A respectively, and a tunable DCDL 1002B, 1004B, 1006B and 1008B respectively. Furthermore, the tunable DCDL 1002B for example comprises a lead portion 1010 and a lag portion 1012, the tunable DCDL 1004B for example comprises a lead portion 1014 and a lag portion 1016, the tunable DCDL 1006B for example comprises a lead portion 1018 and a lag portion 1020, and the tunable DCDL 1008B for example comprises a lead portion 1022 and a lag portion 1024. The lead portions 1010, 1014, 1018 and 1022 are for example controlled by the signal DLEAD_[0:n] generated by the TDC controller 212, and the lag portions 1012, 1016, 1020 and 1024 are for example controlled by the signal DLAG_[0:n]. The nodes 1026, 1028 and 1030 between the DCDLs 1002, 1004, 1006 and 1008 for example respectively provide signals PHASE1, PHASE2 and PHASE3 corresponding respectively to the signal TREF+T/2, the signal TREF+T/2, and the signal TREF+3T/4.

Figure 11:
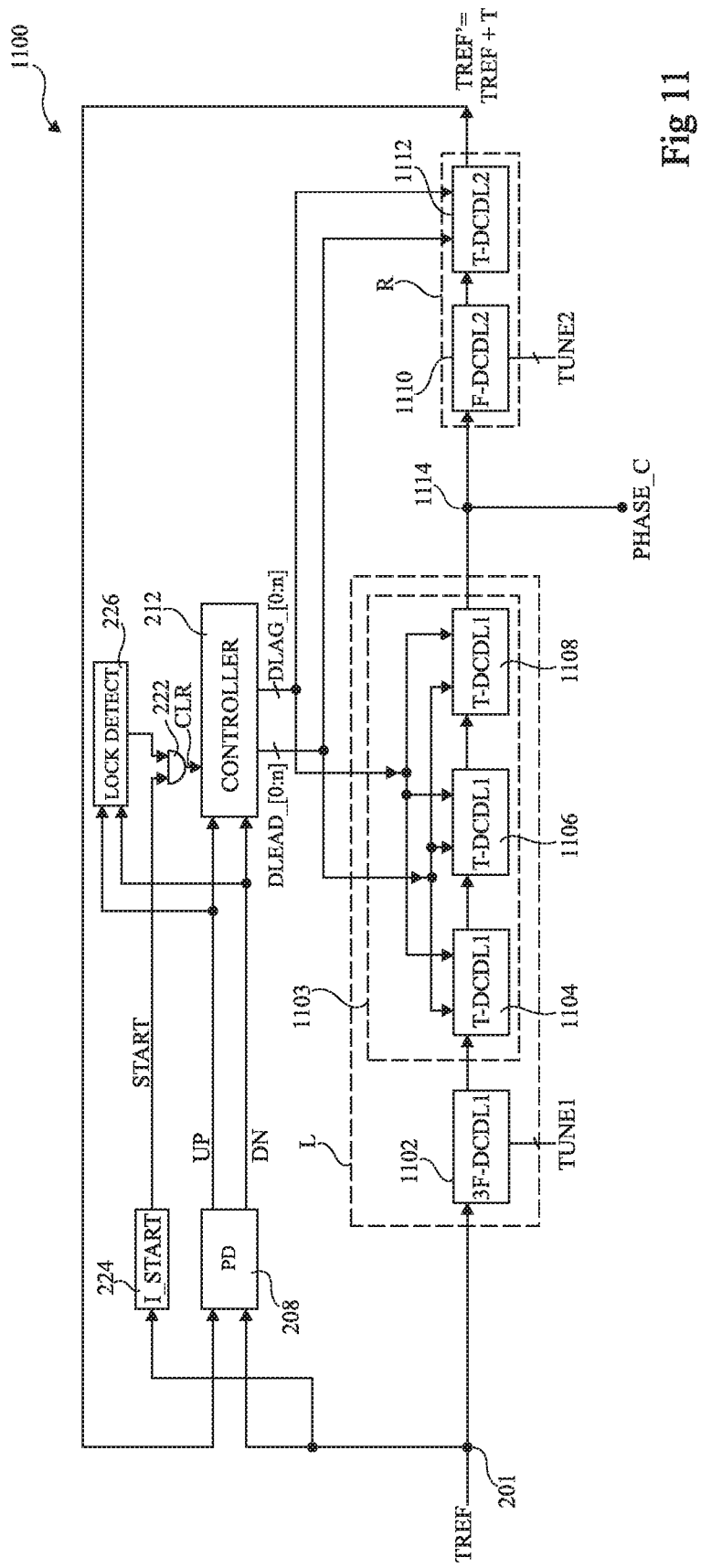
FIG. 11 schematically illustrates a DLL according to yet a further example embodiment.

FIG. 11 schematically illustrates a digital DLL 1100 according to yet a further example embodiment. Many features of the DLL 1100 are similar to features of the DLL 200 of FIG. 2, and these features have been labelled with like reference numerals, and will not be described again in detail.

Like in the DLL 1000 of FIG. 10, in the DLL 1100 of FIG. 11, the digitally controllable delay lines introduce, when tuned, a total delay equal to a full period of the reference signal TREF. In the example of FIG. 11 there is a lefthand delay line L comprising a fixed DCDL (3F-DCDL1) 1102 that can be calibrated by the tuning signal TUNE1, and which is for example capable of introducing three times the delay of the other DCDLs, and a tunable portion 1103 comprising three tunable DCDLs (T-DCDL1) 1104, 1106 and 1108. There is also a right-hand delay line R comprising a fixed DCDL (F_DCDL2) 1110 that can be calibrated by the tuning signal TUNE2, and a tunable portion (T-DCDL2) 1112. Each of the tunable portions 1104, 1106, 1108 and 1112 for example comprises a lead portion controlled by the signal DLEAD_[0:n] generated by the TDC controller 212, and a lag portion controlled by the signal DLAG_[0:n] generated by the TDC controller 212. An intermediate node 1114 between the left-hand and right-hand delay lines L and R can provide a signal having a customable phase, for example corresponding to TREF+nL/(nL+nR), where nL is the number of delay elements in the left-hand delay line L, and nR is the number of delay elements in the right-hand delay line R.

An advantage of the embodiments described herein is that a DLL can be implemented in an all-digital solution in relatively simple fashion, and while using only standard cells that can for example be implemented using CMOS technology.

Having described at least one illustrative embodiment, various alterations, modifications and improvements will readily occur to those skilled in the art. For example, while examples of circuits implementing the selector circuit and delay elements have been described, it will be apparent to those skilled in the art that alternative implementations would be possible.

Furthermore, in some embodiments the flip-flops 504_0 to 504_n in the lead TDC 304 and/or the flip-flops 514_0 to 514_n in the lag TDC 306 could be replaced by synchronizer flip-flops. For example, each flip-flop is replaced by a pair of synchronizer flip-flops coupled in series and both clocked by the signal DN_LAG in the case of the flip-flops of the lead TDC 304, or by the signal UP_LAG in the case of the flip-flops of the lag TDC 306. The phase error estimation and phase error correction would then be performed over two clock cycles, for example two rising edges.

What is claimed is:

1. A digital delay locked loop for applying a phase shift to a reference timing signal, the digital delay locked loop comprising:
   first and second digitally controllable delay lines coupled in series with each other, each comprising a lead portion and a lag portion, the first digitally controllable delay line receiving a reference timing signal and the second digitally controllable delay line outputting a delayed timing signal corresponding to the reference timing signal delayed by the first and second digitally controllable delay lines; and
   a time to digital converter configured to evaluate a phase difference between the reference signal and the delayed timing signal and to generate a first control signal for controlling said lead portions and a second control signal for controlling said lag portions based on the sign and magnitude of the phase difference, wherein the time to digital converter further comprises a selector circuit configured to generate:
   a first pair of timing signals if the phase of the reference signal leads that of the delayed timing signal, wherein a first signal of the first pair comprises a timing edge that leads a timing edge of a second signal of the first pair by said phase difference; and
   a second pair of timing signals if the phase of the reference signal lags that of the delayed timing signal, wherein a first signal of the second pair comprises a timing edge that lends a timing edge of a second signal of the second pair by said phase difference.

2. The digital delay locked loop of claim 1, wherein:
   the lead portions of the first and second digitally controllable delay lines each comprise a plurality of delay elements, and wherein the time to digital converter comprises a corresponding first plurality of delay elements; and
   the lag portions of the first and second digitally controllable delay lines each comprise a plurality of delay elements, and wherein the time to digital converter comprises a corresponding second plurality of delay elements.

3. The digital delay locked loop of claim 2, wherein each of the plurality of delay elements of the lead portions is implemented by a circuit identical to the one implementing each delay element of the first plurality, and each of the plurality of delay elements of the lag portions is implemented by a circuit identical to the one implementing each delay element of the second plurality.

4. The digital delay locked loop of claim 1, wherein the time to digital converter comprises:
   a lead time to digital converter comprising a first delay line formed of a first plurality of delay elements each having an output coupled to an input of a corresponding one of a first plurality of flip-flops, wherein the first signal of the first pair of timing signals is provided to an input of the first delay line, and the first plurality of flip-flops are clocked by the second signal of the first pair of timing signals; and
   a lag time to digital converter comprising a second delay line formed of a second plurality of delay elements each having an output coupled to an input of a corresponding one of a second plurality of flip-flops, wherein the first signal of the second pair of timing signals is provided to an input of the second delay line, and the second plurality of flip-flops are clocked by the second signal of the second pair of timing signals.

5. The digital delay locked loop of claim 4, wherein:
   the first plurality of flip-flops is configured to generate a first digital signal represented by thermometer code, wherein the time to digital converter further comprises a first decoder configured to encode the first digital signal based on one-hot encoding; and
   the second plurality of flip-flops is configured to generate a second digital signal represented by thermometer code, wherein the time to digital converter further comprises a second decoder configured to encode the second digital signal based on one-hot encoding.

6. The digital delay locked loop of claim 1, wherein the time to digital converter further comprises an inverter for inverting the delayed timing signal or the reference timing signal prior to the evaluation of the phase difference by the time to digital converter.

7. A method of controlling a digital delay locked loop to apply a phase shift to a reference timing signal, the method comprising:
- evaluating, by a time to digital converter, a phase difference between the reference signal and a delayed timing signal generated by first and second digitally controllable delay lines coupled in series with each other, each comprising a lead portion and a lag portion, the first digitally controllable delay line receiving a reference timing signal and the second digitally controllable delay line outputting a delayed timing signal corresponding to the reference timing signal delayed by the first and second digitally controllable delay lines;
- generating a first control signal for controlling said lead portions and a second control signal for controlling said lag portions based on the sign and magnitude of the phase difference; and
- generating, by a selector circuit;
- a first pair of timing signals if the phase of the reference signal leads that of the delayed timing signal, wherein a first signal of the first pair comprises a timing edge that leads a timing edge of a second signal of the first pair by said phase difference; and
- a second pair of timing signals if the phase of the reference signal lags that of the delayed timing signal, wherein a first signal of the second pair comprises a timing edge that leads a timing edge of a second signal of the second pair by said phase difference.

* * * * *